(12) United States Patent
Ko et al.

(10) Patent No.: US 9,284,638 B2
(45) Date of Patent: Mar. 15, 2016

(54) METHOD OF FABRICATING MASK ASSEMBLY

(71) Applicant: SAMSUNG DISPLAY CO., LTD., Yongin, Gyeonggi-Do (KR)

(72) Inventors: Jung-Woo Ko, Yongin (KR); Ikunori Kobayashi, Yongin (KR); Sang-Shin Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 112 days.

(21) Appl. No.: 14/019,979

(22) Filed: Sep. 6, 2013

(65) Prior Publication Data

US 2014/0000792 A1  Jan. 2, 2014

Related U.S. Application Data

(62) Division of application No. 12/659,059, filed on Feb. 24, 2010.

(30) Foreign Application Priority Data

Sep. 22, 2009 (KR) .................. 10-2009-0089699

(51) Int. Cl.
 *C23C 14/04* (2006.01)
 *B05C 21/00* (2006.01)

(52) U.S. Cl.
 CPC ............. *C23C 14/042* (2013.01); *B05C 21/005* (2013.01); *Y10T 156/10* (2015.01)

(58) Field of Classification Search
 USPC ............... 118/504, 505, 720, 721; 156/345.3; 204/298.11
 See application file for complete search history.

(56) References Cited

U.S. PATENT DOCUMENTS

| 3,574,012 | A | 4/1971 | Penberg |
| 7,572,338 | B2 | 8/2009 | Kim et al. |
| 2003/0221614 | A1 | 12/2003 | Kang et al. |
| 2004/0020435 | A1 | 2/2004 | Tsuchiya et al. |
| 2004/0202821 | A1 | 10/2004 | Kim et al. |
| 2006/0103289 | A1 | 5/2006 | Kim et al. |
| 2006/0110663 | A1 | 5/2006 | Kim et al. |
| 2009/0151630 | A1 | 6/2009 | Marcanio et al. |

FOREIGN PATENT DOCUMENTS

| CN | 1 779 566 A | 5/2006 |
| JP | 2000-012238 A | 1/2000 |
| JP | 2002-055461 A | 2/2002 |
| JP | 2003-217850 A | 7/2003 |
| JP | 2004-323888 A | 11/2004 |
| JP | 2004-349086 A | 12/2004 |
| JP | 2005-146338 A | 6/2005 |
| JP | 2006-037203 A | 2/2006 |
| JP | 2007-173107 A | 7/2007 |
| JP | 2008-196002 A | 8/2008 |
| KR | 10-2004-0084314 A | 10/2004 |
| KR | 10-2006-0055613 A | 5/2006 |
| KR | 10-2006-0058456 A | 5/2006 |
| KR | 10-2009-0053418 A | 5/2009 |

*Primary Examiner* — Maureen Passey
(74) *Attorney, Agent, or Firm* — Lee & Morse, P.C.

(57) ABSTRACT

A mask assembly, a deposition apparatus for flat panel displays including the same, and associated methods, the mask assembly including an open mask having a plurality of first openings, and a pattern mask coupled to the open mask, the pattern mask having a plurality of second openings disposed within an area bounded by the first openings, wherein the open mask is formed of a material having a thermal expansion coefficient that is lower than a thermal expansion coefficient of the pattern mask.

6 Claims, 3 Drawing Sheets

METHOD OF FABRICATING MASK ASSEMBLY

CROSS REFERENCE TO RELATED APPLICATION

This is a divisional application based on pending application Ser. No. 12/659,059 filed Feb. 24, 2010, the entire contents of which is hereby incorporated by reference.

BACKGROUND

1. Field

Embodiments relate to a mask assembly, a deposition apparatus for flat panel displays including the same, and associated methods.

2. Description of the Related Art

Flat panel displays may exhibit desirable characteristics, e.g., light weight, low thickness, and so on. Typical examples thereof may include, e.g., liquid crystal displays (LCDs) and organic light emitting diode displays (OLEDs). Among them, OLEDs may be implemented as ultra thin displays because of their excellent brightness, wide viewing angle, and absence of a backlight, as compared to LCDs.

An OLED is a display device in which electrons injected from a cathode and holes injected from an anode are recombined to form excitons in an organic thin film. Radiation having a specific wavelength may then be emitted by a release of energy resulting from de-excitation of the excitons.

In the OLED, e.g., photolithography or deposition using a mask assembly having a plurality of slits formed in a predetermined pattern, may be used to selectively form a negative electrode, a positive electrode, and an organic thin film on a substrate. The substrate may be formed of, e.g., glass, stainless steel, or synthetic resin. Because moisture may be introduced during a step of stripping photoresist using wet or dry etching during a photolithography process, deposition using the mask assembly should be used when depositing materials that may be degraded by moisture, e.g., organic thin films.

An OLED may include an organic light emitting element having red (R), green (G), and blue (B) organic light emitting layers in order to display a full range of colors. Deposition using the mask assembly may deposit a thin film having a pattern corresponding to the predetermined pattern. Deposition may occur on a substrate by aligning the mask assembly between the substrate and an evaporation source and then allowing a deposition target to be deposited on the substrate through the mask assembly. Thus, to fabricate the full-color OLED, the mask assembly may include a pattern mask having the predetermined pattern thereon and a frame mask supporting the pattern mask.

The mask assembly may be fabricated by an etching method including, e.g., forming slits by an etching process or an electroforming method using electrolysis. The etching method may be limited in its ability to form the slits in a highly precise pattern because a width of the slit and an interval therebetween may be limited by a thickness of a material. On the other hand, the electroforming method may be used to fabricate the slits with relatively high precision compared to the etching method.

SUMMARY

Embodiments are directed to a mask assembly, a deposition apparatus for flat panel displays including the same, and associated methods, which represent advances over the related art.

It is a feature of an embodiment to provide a mask assembly having improved thermal stability.

It is another feature of an embodiment to provide a mask assembly being capable of preventing a position and shape of openings of the mask assembly from being deformed by an elevated internal temperature of a process chamber during a deposition process.

At least one of the above and other features and advantages may be realized by providing a mask assembly including an open mask having a plurality of first openings, and a pattern mask coupled to the open mask, the pattern mask having a plurality of second openings disposed within an area bounded by the first openings, wherein the open mask is formed of a material having a thermal expansion coefficient that is lower than a thermal expansion coefficient of the pattern mask.

The pattern mask may be formed by an electroforming method.

The second openings of the pattern mask may form a pattern corresponding to a desired pattern of a thin film to be formed on a substrate.

The mask assembly may further include a frame mask coupled to the open mask, the frame mask having a third opening and the first openings being disposed within an area defined by the third opening.

The open and pattern masks may be coupled at first coupling points along edges of the open mask and second coupling points between the first openings of the open mask.

The open mask may have a length and a width, the pattern mask may have a corresponding length and a corresponding width, and the length and width of the open mask may be equal to the corresponding length and width of the pattern mask.

At least one of the above and other features and advantages may also be realized by providing a method of fabricating a mask assembly including preparing an open mask having a plurality of first openings such that each first opening has an area, preparing a pattern mask having a plurality of second openings such that each second opening has an area relatively smaller than the area of each of the first openings, aligning the open mask and the pattern mask such that the second openings are disposed within an area bounded by the first openings, and coupling the open mask to the pattern mask, wherein the open mask is formed of a material having a thermal expansion coefficient that is lower than a thermal expansion coefficient of the pattern mask.

Preparing the pattern mask may include performing an electroforming process.

Preparing the pattern mask may include forming the second openings such that the second openings form a pattern corresponding to a desired pattern of a thin film to be formed on a substrate.

The open mask may have a length and a width, the pattern mask may have a corresponding length and a corresponding width, and the length and width of the open mask may be equal to the corresponding length and width of the pattern mask.

Coupling the open mask to the pattern mask may include a first coupling process, the first coupling process including coupling edges of the open mask to edges of the pattern mask, and a second coupling process, the second coupling process including binding together the open mask and the pattern mask at regions between the first openings of the open mask.

The second coupling process may be carried out after the first coupling process is completed.

The method may further include preparing a frame mask having a third opening aligning the frame mask and the open mask such that all the first openings are disposed within an area bounded by the third opening; and coupling the frame mask to the open mask.

Coupling the frame mask to the open mask may occur after the open mask is coupled to the pattern mask.

At least one of the above and other features and advantages may also be realized by providing a deposition apparatus for flat panel displays including a process chamber, an evaporation source disposed on a side of the process chamber, a mask assembly between the evaporation source and a substrate, the mask assembly including an open mask having a plurality of first openings, and a pattern mask coupled to the open mask, the pattern mask having a plurality of second openings disposed within an area bounded by the first openings, and a holder supporting the substrate and the mask assembly, wherein the open mask of the mask assembly is formed of a material having a thermal expansion coefficient that is lower than a thermal expansion coefficient of the pattern mask.

The pattern mask of the mask assembly may be formed by an electroforming method.

The second openings of the pattern mask may form a pattern corresponding to a desired pattern of a thin film to be formed on the substrate.

The mask assembly may further include a frame mask coupled to the open mask, the frame mask having a third opening and the first openings being disposed within an area bounded by the third opening.

The open mask may be coupled to the pattern mask at first coupling points along edges of the open mask and second coupling points between the first openings of the open mask.

The open mask may have a length and a width, the pattern mask may have a corresponding length and a corresponding width, and the length and width of the open mask may be equal to the corresponding length and width of the pattern mask.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
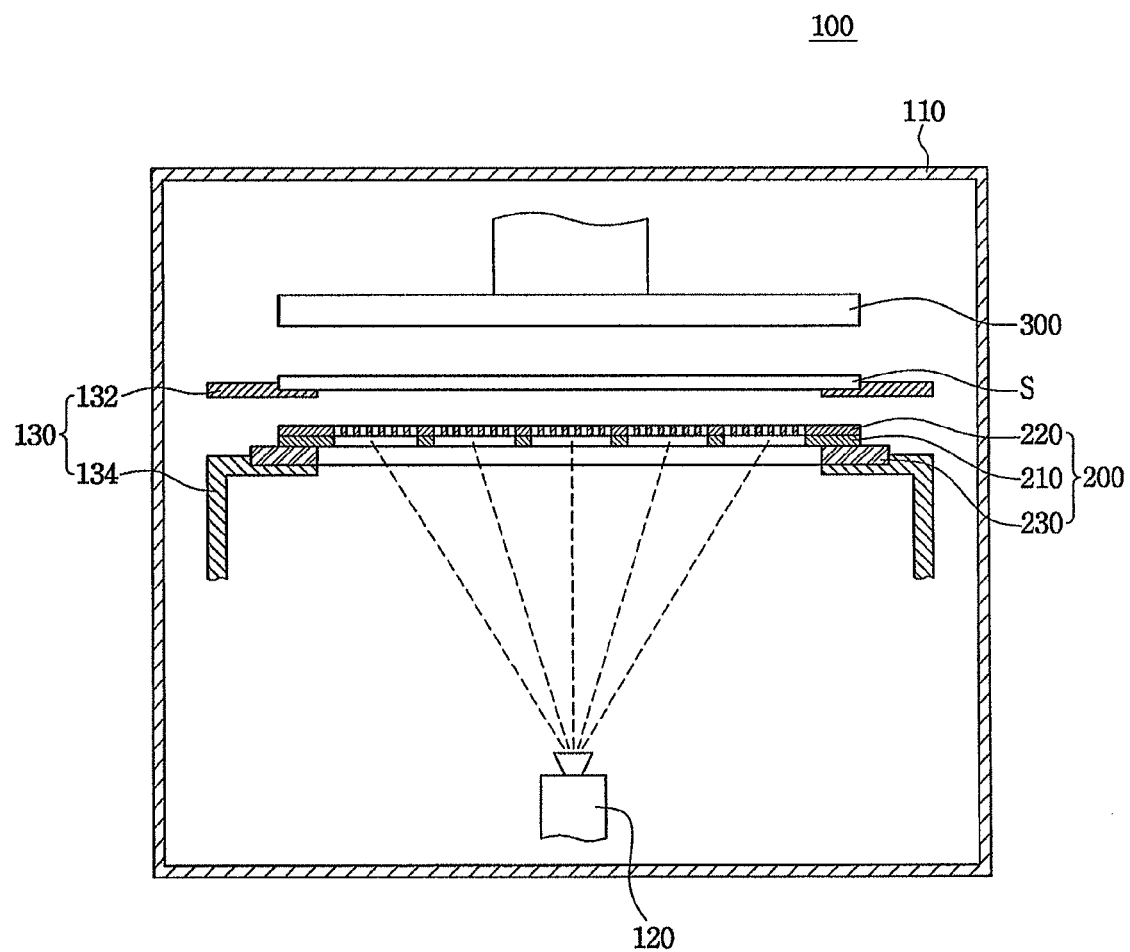
FIG. 1 schematically illustrates a deposition apparatus for flat panel displays according to an embodiment.

Korean Patent Application No. 10-2009-0089699, filed on Sep. 22, 2009, in the Korean Intellectual Property Office, and entitled: "Mask Assembly, Method of Fabricating the Same, and Deposition Apparatus for Flat Panel Displays Using the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 schematically illustrates a deposition apparatus for flat panel displays according to an embodiment. Referring to FIG. 1, the deposition apparatus 100 for flat panel displays may include a process chamber 110, an evaporation source 120 disposed on a side of the process chamber 110, a mask assembly 200 between the evaporation source 120 and a substrate S, and a holder 130 supporting the substrate S. The deposition apparatus 100 for flat panel displays may further include a close contactor 300 for bringing the substrate S into close contact with the mask assembly 200.

A deposition process for depositing a thin film having a predetermined pattern on the substrate S may be carried out in the process chamber 110. The evaporation source 120 may store and spray a deposition target to be deposited on the substrate S. The evaporation source 120 may be disposed on a side of the process chamber 110. Preferably, the evaporation source 120 is disposed at a lower portion of the process chamber 110, such that the deposition target may be uniformly sprayed onto the substrate S, as illustrated in FIG. 1. The thin film deposited by the deposition process may form, e.g., an electrode, an electroluminescent layer, etc., of a display device.

The holder 130 may support the substrate S and the mask assembly 200 to prevent the substrate S and the mask assembly 200 from being dislocated during the deposition process. The holder 130 may include a first holder 132 supporting the substrate S and a second holder 134 supporting the mask assembly 200. In an implementation, as illustrated in FIG. 1, when the evaporation source 120 is located at the lower portion of the process chamber 110, the substrate S may be located on the mask assembly 200, and the mask assembly 200 may be supported by the holder 130. Thus, both the substrate S and the mask assembly 200 may be supported by the holder 130.

The mask assembly 200 may be configured such that the deposition target sprayed from the evaporation source 120 may be deposited on the substrate S as a thin film having a predetermined pattern. The mask assembly 200 may include a pattern mask 220 including openings corresponding to a desired pattern of the thin film on the substrate S. The mask assembly 200 may also include an open mask 210 coupled to the pattern mask 220.

Figure 2A:
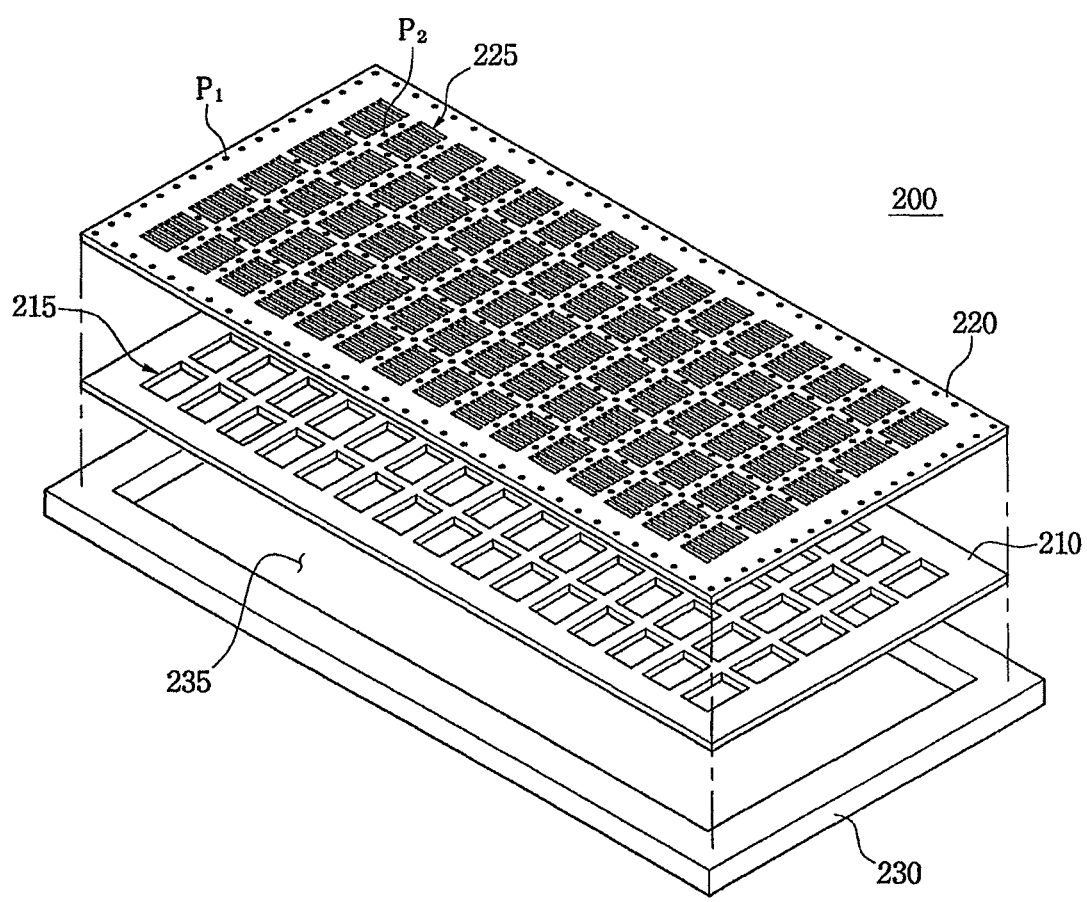
FIG. 2A illustrates an exploded perspective view of a mask assembly used in the deposition apparatus for flat panel displays according to an embodiment.
Figure 2B:
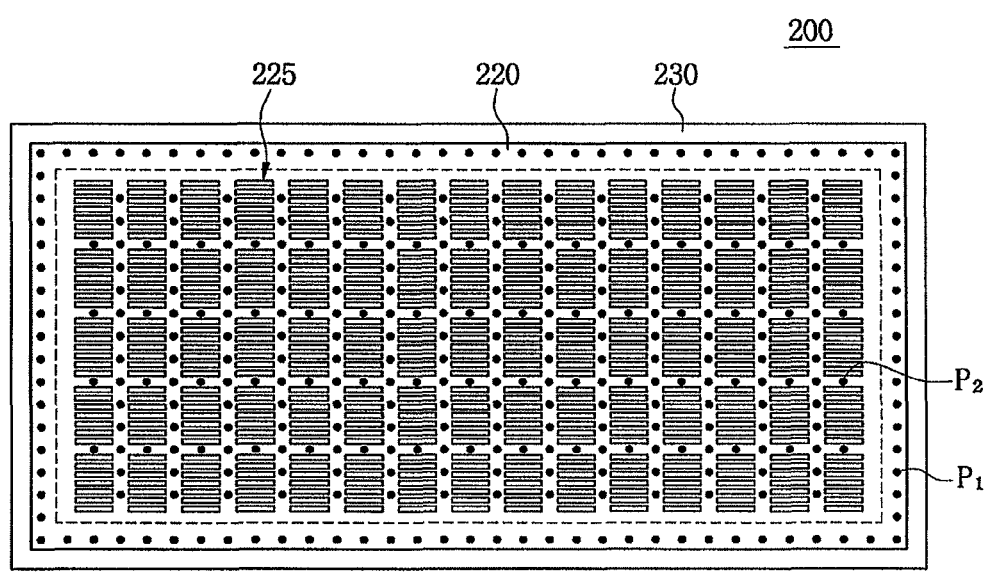
FIG. 2B illustrates a plan view of the mask assembly used in the deposition apparatus for flat panel displays according to an embodiment.

FIG. 2A illustrates an exploded perspective view of a mask assembly used in a deposition apparatus for flat panel displays according to an embodiment. FIG. 2B illustrates a plan view of the mask assembly used in the deposition apparatus for flat panel displays according to an embodiment.

Referring to FIGS. 2A and 2B, the mask assembly 200 of the deposition apparatus 100 for flat panel displays may include an open mask 210 having a plurality of first openings 215 and a pattern mask 220 coupled to the open mask 210. The pattern mask 220 may have a plurality of second openings 225 inside the first openings 215. In other words, the plurality of second openings 225 of the pattern mask 220 may be disposed within an area bounded by the first openings 215. Further, each second opening 225 may be disposed within the area bounded by only one of the first openings 215.

The pattern mask 220 including second openings 225 may be formed by an electroforming method using electrolysis.

Such a method may help ensure that a highly precise pattern of second openings 225 is formed. Thus, a highly precise pattern of thin films may be formed on the substrate S.

The open mask 210 may be coupled to the pattern mask 220. The open mask 210 may, e.g., prevent a position and a shape of the second openings 225 of the pattern mask 220 from being deformed by an elevated internal temperature of the process chamber 110 during the deposition process. The open mask 210 may be formed of a material having a thermal expansion coefficient that is relatively lower than a thermal expansion coefficient of the pattern mask 220. Thus, the open mask 210 may inhibit thermal expansion of the pattern mask 220 during the deposition process. In an implementation, the open mask 210 may be joined or coupled to the pattern mask 220 by, e.g., adhesion, soldering, and/or welding. Preferably, the open mask 210 is welded to the pattern mask 220 in consideration of the internal temperature of the process chamber 100 during the deposition process.

Regions between the first openings 215 of the open mask 210 may serve as supports, preventing the pattern mask 220 from sagging downwards. In order to more firmly couple the open mask 210 to the pattern mask 220, the open and pattern masks 210 and 220 may be coupled through first coupling points P1 along edges of the open and pattern masks 210 and 220, and second coupling points P2 between the first openings 215 of the open mask 210. Preferably, the first coupling points P1 are first welding points and the second coupling points P2 are second welding points.

Preferably, the open mask 210 has the same width and length, i.e. is the same size, as the pattern mask 220. Accordingly, the open and pattern masks 210 and 220 may be easily aligned with and coupled to each other.

The mask assembly 200 may further include a frame mask 230. The frame mask 230 may be coupled to the open mask 210. The frame mask 230 may have a third opening 235. The first openings 215 of the open mask 210 may be disposed within an area bounded by the third opening 235. Such a configuration may allow the holder 130 to be easily coupled to the mask assembly 200.

A method of fabricating the mask assembly 200 of the deposition apparatus 100 for flat panel displays according to an embodiment will be described with reference to FIGS. 2A and 2B. First, both the open mask 210 having the plurality of first openings 215 and the pattern mask 220 having the plurality of second openings 225 may be prepared such that the second openings 225 have a relatively small area compared to the first openings 215. In an implementation, the pattern mask 220 may be formed by an electroforming method using electrolysis such that a highly precise pattern may be formed. For example, the pattern mask 220 may be formed of nickel (Ni) having a thermal expansion coefficient of $12.8 \times 10^{-6}$. The open mask 210 may be formed of, e.g., a nickel-steel alloy, having a thermal expansion coefficient of $2.0 \times 10^{-6}$, which is relatively lower than that of the nickel. In certain example embodiments, the open mask may be formed of the alloy INVAR (e.g., a nickel-iron alloy including about 63.8% iron, 36% nickel, and about 0.2% carbon).

Next, the open mask 210 may be aligned with and coupled to the pattern mask 220 such that the second openings 225 of the pattern mask 220 are disposed within an area bounded by the first openings 215 of the open mask 210. In an implementation, the joining or coupling between the open mask 210 and the pattern mask 220 may include, e.g., adhesion, soldering, or welding. Preferably, the open mask 210 is welded to the pattern mask 220, considering that the deposition process may be carried out under high temperature in the process chamber 110.

The open mask 210 may be coupled to the pattern mask 220 by a first coupling process including coupling edges of the open and pattern masks 210 and 220 and a second coupling process including binding or coupling together the open mask 210 and pattern mask 220 at regions between the first openings 215 of the open mask 210 such that the open mask 210 may be more firmly coupled to the pattern mask 220. In an implementation, first coupling process may be a first welding process including welding edges of the open and pattern masks 210 and 220 at the first welding points and the second coupling process may include a second welding process including welding at least certain regions between the first openings 215 of the open mask 210 to the pattern mask 220 at the second welding points. Preferably, the first welding points are formed by welding the edges of the open and pattern masks 210 and 220 using the first welding process, and the second welding points are formed by welding the regions between the first openings 215 of the open mask 210 to the pattern mask 220 using the second welding process. Accordingly, the first openings 215 of the open mask 210 may not be misaligned with the second openings 225 of the pattern mask 220 when the open mask 210 is coupled to the pattern mask 220.

In an implementation, the open mask 210 may have a same width and length, i.e. may be the same size, as the pattern mask 220. Such a configuration may help ensure that the aligning and coupling processes of the open and pattern masks 210 and 220 are easily carried out.

Next, the frame mask 230 supporting the open and pattern masks 210 and 220 and having a third opening 235 may be prepared. The frame mask 230 may be aligned with the open mask 210 such that all the first openings 215 of the open mask 210 are disposed within an area bounded by the third opening 235. Then, the frame mask 230 may be coupled to the open mask 210.

Preferably, the open mask 210 is coupled to the pattern mask 220 such that the open and pattern masks 210 and 220 are aligned with and coupled to each other. Then, the frame mask 230 may be coupled to the open mask 210.

The deposition apparatus for flat panel displays according to an embodiment may deposit the thin film on the substrate using the mask assembly including the pattern mask 220 having the plurality of second openings 225. Thus, the thin film may be formed on the substrate in a pattern corresponding to the second openings 225 of the pattern mask 220.

The mask assembly may also include the open mask 210 coupled to the pattern mask 220, the open mask 210 being formed of the material having the relatively lower thermal expansion coefficient compared to the pattern mask 220. Such a configuration may prevent the position and shape of the second openings 225 of the pattern mask 220 from being deformed by the higher internal temperature of the process chamber during the deposition process, even if the pattern mask 220 is formed of a material having a relatively high thermal expansion coefficient. Furthermore, the mask assembly of an embodiment may help ensure that a thin film having a highly precise pattern corresponding to the second openings 225 is stably deposited on the substrate.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a mask assembly, comprising:
preparing an open mask having a plurality of first openings such that each first opening has an area;
preparing a pattern mask having a plurality of second openings such that each second opening has an area relatively smaller than the area of each of the first openings;
aligning the open mask and the pattern mask such that the second openings are disposed within an area bounded by the first openings;
coupling a first side of the open mask to the pattern mask, the coupling of the open mask to the pattern mask including a first welding process, the first welding process including welding edges of the open mask to edges of the pattern mask, and a second welding process, the second welding process including binding together the open mask and the pattern mask at regions between the first openings of the open mask, the second welding process being carried out after the first welding process is completed; and
coupling a second side of the open mask to a frame mask, the frame mask having a length and width each larger than that of the open mask,
wherein the open mask is formed of a material having a thermal expansion coefficient that is lower than a thermal expansion coefficient of the pattern mask, and the open mask has a same size as the pattern mask.

2. The method as claimed in claim 1, wherein preparing the pattern mask includes performing an electroforming process.

3. The method as claimed in claim 1, wherein preparing the pattern mask includes forming the second openings such that the second openings form a pattern corresponding to a desired pattern of a thin film to be formed on a substrate.

4. The method as claimed in claim 1, wherein the open mask has a length and a width, the pattern mask has a corresponding length and a corresponding width, and the length and width of the open mask are equal to the corresponding length and width of the pattern mask.

5. The method as claimed in claim 1, further comprising:
preparing the frame mask to have a third opening; and
aligning the frame mask and the open mask such that all the first openings are disposed within an area bounded by the third opening.

6. The method as claimed in claim 5, wherein coupling the frame mask to the open mask occurs after the open mask is coupled to the pattern mask.

* * * * *